United States Patent [19]

McCoy et al.

[11] Patent Number: 4,918,919

[45] Date of Patent: Apr. 24, 1990

[54] SPLIT MEMORY ELEMENT

[75] Inventors: William C. McCoy, Zionsville; James E. Small, Logansport; Gregory Cole, Carmel, all of Ind.

[73] Assignee: Catheter Research, Inc., Indianapolis, Ind.

[21] Appl. No.: 383,233

[22] Filed: Jul. 19, 1989

Related U.S. Application Data

[63] Continuation of Ser. No. 246,430, Sep. 19, 1988, abandoned, which is a continuation-in-part of Ser. No. 104,641, Oct. 2, 1987, Pat. No. 4,777,799.

[51] Int. Cl.⁵ .................................................. F03G 7/06
[52] U.S. Cl. ............................................. 60/528; 60/527
[58] Field of Search .......................... 60/527, 528, 529

[56] References Cited

U.S. PATENT DOCUMENTS

| | | | |
|---|---|---|---|
| 3,290,479 | 12/1966 | Avedissian | 219/85 |
| 3,520,055 | 7/1970 | Jannett | 29/628 |
| 3,890,977 | 6/1975 | Wilson | 128/418 |
| 4,135,224 | 1/1979 | Maher | 361/321 |
| 4,229,865 | 10/1980 | Fanning | 29/25.42 |
| 4,238,661 | 12/1980 | Braunlich | 219/121 |
| 4,327,277 | 4/1982 | Daly | 219/121 |
| 4,411,655 | 10/1983 | Schreck | 604/165 |
| 4,543,090 | 9/1985 | McCoy | 604/95 |
| 4,551,974 | 11/1985 | Yaeger et al. | 60/528 X |
| 4,556,050 | 12/1985 | Hodgson et al. | 60/527 |
| 4,601,705 | 7/1986 | McCoy | 604/95 |
| 4,605,835 | 8/1986 | Deffeyes | 219/85 |
| 4,776,844 | 10/1988 | Ueda | 604/95 |
| 4,799,474 | 1/1989 | Ueda | 128/4 |

FOREIGN PATENT DOCUMENTS 60-145385  7/1985  Japan .

OTHER PUBLICATIONS

J. Ap. Phys., vol. 36, No. 10, pp. 3232–3239, Oct. 1965, F. E. Wang et al.
J. Ap. Phys., vol. 39, No. 5, pp. 2166–2175, Apr. 1968, F. E. Wang et al.

Primary Examiner—Allen M. Ostrager
Attorney, Agent, or Firm—Barnes & Thornburg

[57] ABSTRACT

A memory element of the present invention is split to minimize the magnitude of electrical current flowing therethrough as the split memory element is being heated to its transitional temperature, thereby permitting the cross-sectional area of the lead wires used to conduct an electric current to the memory element to be minimized. The split memory element includes a tip member and first and second strip members aligned in side-by-side relation. Each of the tip member, first strip member, and second strip member are made of a shape-memory alloy and have a characteristic internal structure. Each strip member includes a shape-memory portion coupled to the tip member, a lead-attachment portion, and partition means for interconnecting the shape-memory and lead-attachment portions. Each partition means has an internal structure which is dissimilar to the characteristic internal structure of the tip member and the first and second strip members so that certain ions originating in the electrically conductive wire lead coupled to the lead-attachment portions are substantially isolated or otherwise contained in the lead-attachment portions to prevent contamination of the shape-memory portions.

34 Claims, 3 Drawing Sheets

SPLIT MEMORY ELEMENT

BACKGROUND AND SUMMARY OF THE INVENTION

This is a continuation application of Ser. No. 246,430, filed Sept. 19, 1988, now abandoned, which application was a continuation-in-part application of Ser. No. 104,641, filed Oct. 2, 1987 and entitled "Memory Element", now U.S. Pat. No. 4,777,799.

The present invention relates to temperature-activated memory elements made of a shape-memory alloy. More particularly, the present invention relates to a bifurcated memory element having at least a lead-attachment portion and a substantially uncontaminated split shape-memory portion.

Alloys exhibiting a shape-memory effect are well known. For example, alloys of nickel-titanium, gold-cadmium, iron-platinum, indium-cadmium, iron-nickel, nickel-aluminum, and others have been observed to exhibit shape-memory characteristics. These alloys are known to exhibit a shape-memory effect upon martensitic transformation from a parent phase to a martensitic, or reversely, from a martensitic to a parent phase. Many properties of such alloys are discussed, for example, in *Shape Memory Effects in Alloys*, edited by Jeff Perkins, 583 pages, Plenum Press (1975).

During development of the present invention, temperature-activated memory elements made of shape-memory alloys were observed to experience varying degrees of dysfunction after several temperature-activation cycles. Such dysfunction is characterized, in part, by an inability of the memory element to move to assume its predetermined shape during reverse martensitic transformation when heated to a predetermined temperature. It was experimentally determined that such dysfunction results from introduction of contaminants into the memory element. These contaminants may come from, for example, an electrically conductive lead or the like which is cohered to the memory element to permit an electric flow so as to heat the memory element to its predetermined temperature.

Contamination of a memory element is thought to result from introduction of certain ions into the crystal lattice of the shape-memory alloy comprising the memory element during martensitic transformation. An electrically conductive lead, solder, or the like cohered (i.e., soldered or welded) to the memory element provides a source of said certain foreign ions. For example, ions of silver, cadmium, lead, ion, or other ions are thought to enter and "poison" the crystalline structure of the shape-memory alloyed mechanism, thereby damaging or otherwise weakening the shape-memory effect function of the memory element during martensitic transformation.

During martensitic transformation, nickel-titanium shape-memory alloys (nitinol) undergo a "second order transformation" having an undefined intermediate phase between the parent phase and martensite. The crystal lattice of such alloys provides an internal structure which is very susceptible to migration and diffusion of foreign ions. Reference is hereby made to F. E. Wang, W. J. Buehler, and S. J. Pickart, "Crystal Structure and a Unique 'Martensitic' Transition of TiNi," *J.Ap.Phys.*, 36 (1965); and F. E. Wang, B. F. DeSavage, and W. J. Buehler, "The Irreversible Critical Range in the TiNi Transition," *J.Ap.Phys.*, 39 (1968) for descriptions of transformation characteristics and properties of nitinol.

Ionic contamination of such shape-memory alloyed mechanisms is thought to result, in part, from a complete or partial migration of contaminnt ions through the mechanism during martensitic transformation. Essentially, the contaminant ions enter the mechanism at a lead-attachment site and then migrate individually or by means of a "domino-type" effect through the entire mechanism. It has been observed in the development of the present invention that relatively small concentrations of such ionic contaminants in a mechanism are sufficient to damage or weaken the shape-memory effect function of the mechanism.

One object of the present invention is to provide a memory element configured to move to assume its predetermined shape repeatedly when heated to its predetermined transition temperature without experiencing significant functional degradation due to contamination.

Another object of the present invention is to provide a memory element cohered (soldered or welded) to a lead wire or the like which can still move to assume its predetermined shape repeatedly without experiencing significant functional degradation due to contamination when subjected to thermal cycling through the transformation.

Yet another object of the present invention is to minimize dysfunction of a memory element by controlling the introduction of contaminants into the crystal lattice of a selected shape-memory portion of the memory element so that contaminant concentration levels in the selected shape-memory portion are regulated.

Still another object of the present invention is to provide a method of acting upon a memory element to disrupt the crystalline structure of a selected portion thereof or otherwise alter the selected portion to form barrier means in the memory element for limiting the migration of selected ionic materials or other contaminants across the memory element.

A further object of the present invention is to provide a memory element configured to minimize the magnitude of electrical current flowing therethrough as the memory element is being heated to its transitional temperature.

Another object of the present invention is to Provide a memory element configured to minimize the cross-sectional area of the lead wires used to conduct an electric current to the memory element.

Still another object of the present invention is to provide a memory element configured to permit the electrically conductive lead wires to be attached to only one end of the memory element.

According to the present invention, a memory element includes a tip member and first and second strip members aligned in side-by-side relation. Each of the tip member, first strip member, and second strip member are made of a shape-memory alloy and have a characteristic internal structure. Each strip member includes a proximal portion coupled to the tip member, a distal portion, and partition means for interconnecting the proximal and distal portions. Each partition means has an internal structure which is dissimilar to the characteristic internal structure of the tip member and the first and second strip members.

In preferred embodiments, the dissimilar internal structure in each strip member is configured to block transmigration of selected ions between its proximal and distal portions. Each distal portion of a strip member is coupled to an electrically conductive lead used to heat the memory element.

In use, the dissimilar internal structure forming the partition means is thought to filter certain ions originating in the electrically conductive lead attached to the distal portion and moving from the distal portion toward the proximal portion so that such ions are substantially isolated or otherwise contained in the distal portion. Advantageously, such containment effectively limits to the distal portion any degradation of the shape-memory effect function of the memory element that might occur due to ionic contamination. Thus, the substantially uncontaminated proximal and tip portions are free to assume a "memorized" shape when heated to its memory temperature, even though the distal portion may not function in quite the same way. The dissimilar internal structures of the partition means cooperate to provide means for blocking transmigration between the distal portions and the first strip, second strip, and tip members of selected ions indigenous to the electrically conductive leads to control the concentration of said selected ions in the first strip, second strip, and tip members. Thus, the dissimilar internal structure provides a barrier that is in a state that does not undergo martensitic transformation and thus is not conducive to ion migration but serves to provide a block preventing ions from migrating from, for example, the distal portion of each strip member to the proximal and tip portions.

Essentially, the distal portions of each strip member cooperate to define a lead-attachment part and the tip member and the proximal portions of each strip member cooperate to define a shape-memory part. At least the shape-memory part moves to assume a predetermined shape when heated to a predetermined temperature because of the ion contamination barrier provided by the partition means. Importantly, the partition means includes means for communicating energy from the lead-attachment part to heat the shape-memory part to its predetermined temperature so that at least the shape-memory part assumes its predetermined shape.

Also in preferred embodiments, insulator means is disposed between the first and second strip members for blocking conduction of electrical current between the first and second strip members along a path bypassing the tip member. Illustratively, the first and second strip members cooperate to define a space therebetween extending between the tip member and the terminal ends of both distal portions and the insulator means is situated in the space.

Preferably, the insulator means is arranged substantially to fill the space between the first and second strip members. The insulator means desirably includes means for bonding the first and second strip members together so that at least the proximal portions of the first and second strip members move in unison in the same direction to assume a predetermined shape when heated to a predetermined temperature.

One feature of the present invention is the provision of partition means in each of the first and second strip members in the memory element. Advantageously, the partition means preserves the shape-memory function of the tip member and the proximal portions of the first and second strip members by restricting any ion contamination to the distal portions which are attached to the lead wires. Thus, at least the tip member and the proximal portions connected to the tip member will move to assume a predetermined shape when heated to the transition temperature of the memory element by electrical current conducted through the first strip member, tip member, and second strip member via the lead wires attached to the distal portions of the first and second strip members.

Another feature of the present invention is the provision of insulator means between the first and second strip members for blocking conduction of electrical current along a path bypassing the tip member. The memory element is a conductor and the provision of the insulator means ensures that the "effective length" of the conductor provide memory element is the sum of the lengths of the first and second strip members and the width of the tip member instead of the actual length of the memory element itself.

The resistance of the memory element is increased by increasing its effective length, in accordance with the prevent invention, thereby reducing the magnitude of electrical current conducted through the memory element at constant power during heating of the memory element to its transition temperature. By reducing the magnitude of electrical current conducted through the memory element, it is possible to reduce the cross-sectional area of the electrically conductive leads attached to the memory element, thereby advantageously minimizing the size and maximizing the flexibility of the assembly package provided by the memory element and its attached lead wires.

Yet another feature of the present invention is the provision in the insulator means of means for bonding the first and second strip members together. This bonding advantageously causes at least the proximal portions of the first and second strip members to move in unison in the same direction to assume a predetermined shape when heated to the transition temperature of the memory element.

Additional objects, features, and advantages of the invention will become apparent to those skilled in the art upon consideration of the following detailed description of preferred embodiments exemplifying the best modes of carrying out the invention as presently perceived.

BRIEF DESCRIPTION OF THE DRAWINGS

The detailed description particularly refers to the accompanying figures in which.

DETAILED DESCRIPTION OF THE DRAWINGS

Maintaining a shape-memory effect characteristic of a shape-memory alloy mechanism after such alloy mechanism has been transformed into a memory element with attached wire leads is of central importance to the apparatus and method of the present invention. Treatment of a section of the alloy mechanism using an energy source such as a laser disrupts or alters the crystalline structure of that section of the mechanism sufficiently to block significant transmigration of predetermined ionic material across the section. The "disrupted" section is a thermally-stressed zone which acts as a barrier to ion flow or movement in the mechanism from a lead-attachment portion to a shape-memory portion. The "ion flow" barrier aids in preventing significant ion contamination of the shape-memory portion by ions existing in the lead-attachment portion, which ions operate to weaken the shape-memory effect of the alloy itself. Advantageously, such an ion flow barrier preserves the shape-memory effect characteristics of the mechanism's shape-memory portion to enhance the durability and useful life of the memory mechanism.

Figures 1, 2, 3:
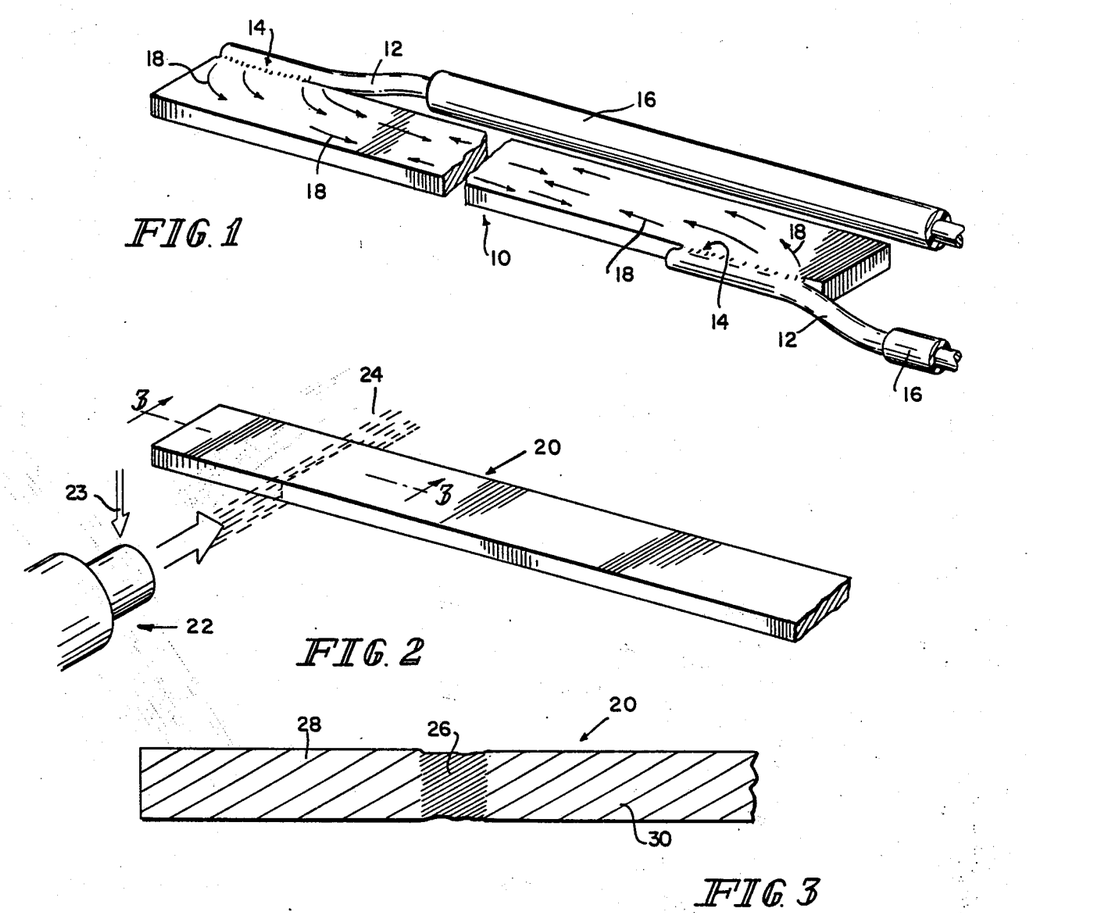
FIG. 1 is a perspective view of a contaminated memory element.
FIG. 2 is a perspective view of a memory element during exposure to energy generated by a laser beam.
FIG. 3 is an enlarged sectional view taken along lines 3—3 of FIG. 2 illustrating a first embodiment of the present invention and diagrammatically showing the dissimilar internal structure of the partition means as compared to the like internal structures of the spaced-apart lead-attachment and shape-memory portions.

A contaminated memory element 10 is illustrated in FIG. 1. Each wire lead 12 is connected to memory element 10 at junction 14 by conventional connection means (e.g., welding, soldering, etc.) to conduct electricity to the memory element for element-heating purposes. Typically, wire lead 12 is made of silver and partially covered with insulation 16. In the illustrated embodiment, a heat source was used to melt the silver wire lead, thereby fusing the wire lead to the memory element. In another embodiment (not shown), solder can be used to melt and fuse the wire lead to the memory element.

Arrows 18 represent the flow of ions communicated to memory element 10 from wire lead 12 and/or connection means (in the case of solder or the like). The presence of ionic material 18 in the alloy mechanism comprising memory element 10 creates an impurity which has a concentration significant enough to weaken shape-memory effect characteristics of the alloy mechanism. Ionic contamination of nickel-titanium alloys (nitinol) of the type generally used in the manufacture of temperature-activated memory elements has been observed during development of the present invention to limit the functional life of such memory elements.

On a molecular level, it is thought that ionic material rapidly migrates through and defiles the crystal lattice of the alloy mechanism sufficiently to damage certain shape-memory effect characteristics of the alloy mechanism. Although the nature of such ion movement is not fully understood, it is thought that the ions migrate individually or by means of a domino-type effect through the mechanism. Ionic material 18 may consist essentially of silver, lead, iron, or other ions leached or otherwise infused into memory element 10 from wire lead 12 and/or solder connection means or the like.

The present invention is directed to development of partition means in a memory element for dividing the memory element into a small "sacrificial" first portion which will later become contaminated with ionic material 18 when communicated with wire lead means and a relatively larger "unpoisoned" second portion protected from ion contamination by the partition means. Thus, the alloy mechanism comprising the second portion will continue to exhibit substantially unspoiled shape-memory effect characteristics even after attachment of wire leads to the first portion and introduction of an electrical operating current into the mechanism.

A preferred method of creating the above-described partition means in an uncontaminated memory element 20 is illustrated in FIG. 2. An energy source 22 is moved, for example, in the direction of double arrow 23 to direct a stream of energy represented by broken lines 24 through a selected portion of memory element 20. Energy stream 24 can be provided by, for example, lasar means, electron beam means, shock wave means ultrasonic wave means, microwave means, electrical capacitive means, TIG-welding means, resistance welding means, or the like.

Energy stream 24 is of sufficient magnitude and character to disrupt the crystalline structure of the alloy mechanism comprising memory element 20. Such disruption is continued for a period of time sufficient to create localized melting and to otherwise alter the normal crystalline structure of the alloy mechanism to provide a predetermined dissimilar structure having ion migration-blocking properties. Thus, a region having a different internal structure is created within memory element 20. Although it is thought that this different internal structure is amorphous, it is suspected that a crystalline structure could also provide suitable partition means.

An energy stream having a magnitude and character less than that which is required to weld a silver lead to a nitinol memory element has been found to be satisfactory. For example, an intensity of about 1.2–1.9 kv is satisfactory and slightly less than a conventional welding intensity of about 2 0–2.7kv. It has been found that if the intensity of the energy stream is too great, a region of increased resistivity could be formed in the thermally-stressed partitioning region, thereby creating an unwanted hot spot. The selection and operation of equipment suitable to provide such an energy stream 24 will be known to those of ordinary skill in the art.

One arrangement of the two internal structures in memory element 20 produced using the above-described method is illustrated in FIG. 3. Partition means 26 created by energy stream 24 bifurcates memory element 20 to provide lead-attachment portion 28 and shape-memory portion 30. Portions 28 and 30 comprise the normal crystalline internal structure of the alloy mechanism comprising memory element 20 while partition means 26 comprises a thermally-stressed dissimilar internal structure. In particular, the dissimilar internal structure is configured to block transmigration of selected ions between the lead-attachment and shape-memory portions 28, 30.

Figures 4, 5:
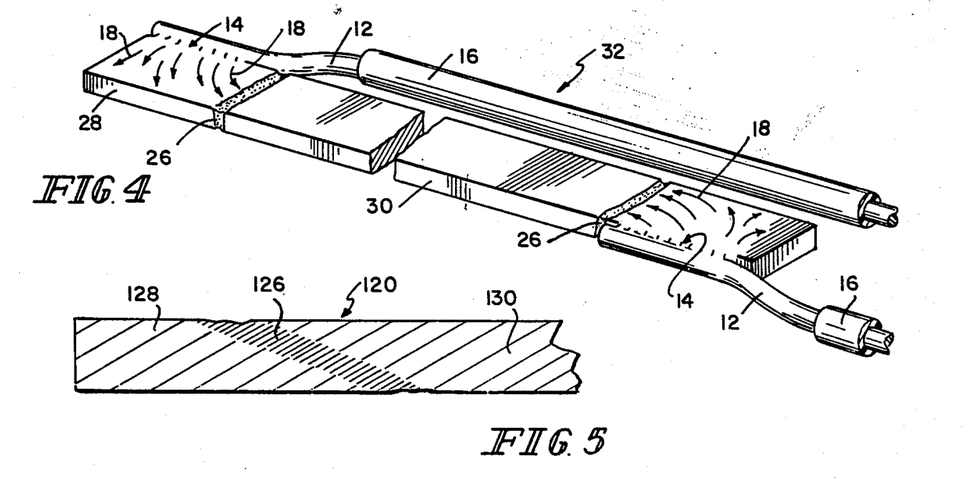
FIG. 4 is an enlarged perspective view of the memory element of FIG. 3 after attachment of a wire lead to each of the distal first portions.
FIG. 5 is a sectional view similar to the view shown in FIG. 3 and illustrating a second embodiment of the present invention.

A preferred complete memory assembly 32 is illustrated in FIG. 4. In practice, a wire lead 12 is connected to each end of a memory element after formation of the thermally-stressed partition means to provide means for heating the memory element to a predetermined temperature so that the memory element moves to assume a predetermined shape. U.S. Pat. Nos. 4,543,000 and 4,601,705 and U.S. patent application Ser. No. 06/870,926, filed June 5, 1986, disclose memory elements suitable for treatment by the method of the present invention and an operative environment for such memory elements and are hereby incorporated by reference.

In operation, power is provided to the lead-attachment portions 28 to heat the memory element in FIG. 4 sufficiently to induce reverse martensitic transformation of the alloy mechanism comprising the memory element. However, ionic material 18 communicated to the lead-attachment portions 28 from wire leads 12 and/or solder connection means is substantially blocked by the partition means 26 to prevent movement into shape-memory portion 30. Thus, shape-memory portion 30 retains the shape-memory effect characteristics of the basic alloy mechanism comprising the memory element.

Importantly, partition means 26 has an altered internal structure which acts to filter selected ionic materials 18 without substantially inhibiting the flow of electric current into shape-memory portion 30. Thus, exposing a selected portion of memory element 20 to energy 24 acts to change somewhat the molecular structure of the alloy mechanism comprising a memory element 20 without substantially changing the electrical conductivity or mechanical properties of such mechanism.

It will be appreciated that an applied electric current heats the alloy mechanism comprising the shape-memory portion 30 to a transformation temperature which causes said portion 30 to move to assume its predetermined shape. Operation of the memory element is not substantially impaired due to any partial or complete failure of a lead-attachment portion 28 to perform in accordance with its own shape-memory effect characteristics resulting from ion poisoning or contamination since the shape-memory portion 30 is dimensionally larger than either of the lead-attachment portions 28.

EXAMPLE

A nitinol element and a silver lead wire are rigidly held in good contact with one another in an aluminum fixture. The fixture is formed to include holes on top for allowing Argon gas flow. A laser beam provided by an Nd doped glass laser head is used to create barrier region 26 in the nitinol memory element 20. A selected portion of element 20 is exposed to a laser intensity of about 1.2 to 1.9 kv to create region 26. A typical weld intensity is about 2.0 to 2.7 kv. The exposure duration is about 30 pulses or minute and the target element is mechanically moved in between pulses.

An analysis of the silver concentration in several nitinol memory elements demonstrates the ion migration-blocking effectiveness of barrier 26 provided in a nitinol memory element made in accordance with the method of the present invention. For purposes of this analysis, a "non-barriered" element is a conventional nitinol memory element, while a "barriered" element is a nitinol memory element treated using a laser energy source 22 to form a partition 26. Fragments of the center portion of each non-barriered element and of the shape-memory portion 30 of each barriered element were analyzed using conventional graphite furnace atomic absorption techniques and instrumentation to determine the silver concentration therein.

The above-described analysis produced the following results for test elements Nos. 1-4: (1) a non-barriered element with silver leads attached had 72 parts per million of silver; (2) a barriered element with silver leads attached, the element having been exposed to a temperature-activation cycle, had only 5 parts per million of silver; (3) an "uncycled" barriered element with silver leads attached had only 3.8 parts per million of silver; and (4) an "uncycled" barriered element without any leads attached had 2.6 parts per million of silver. The reduction in transmigration of silver ions from a "poisoned" lead-attachment portion 28 to an "uncontaminated" shape-memory portion 30 is clearly evidenced by the decrease in silver concentration in test element Nos. 2 and 3 as compared to test element No. 1. Accordingly, this illustrative data demonstrates that barrier 26 effectively blocks transmigration of selected silver ions between the lead-attachment and shape-memory portions 28, 30 of a nitinol memory element treated in accordance with the present invention.

Figure 6:
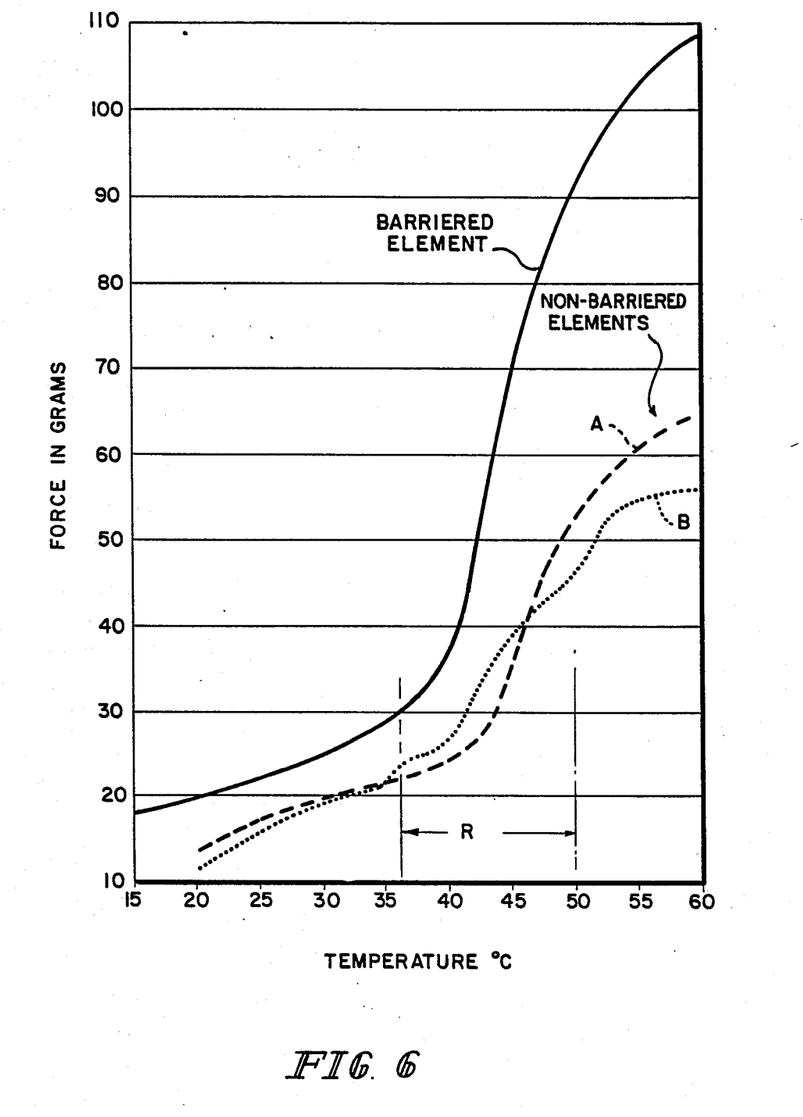
FIG. 6 is a graph illustrating a plot of element tip force versus element temperature for several cycled memory elements and demonstrating improved operation of a memory element made in accordance with the present invention as compared to conventional memory elements.

An improvement in the shape-memory effect function of a barriered memory element as compared to non-barriered memory elements is demonstrated in FIG. 6. A plot of the force generated by a distal tip of three different nitinol memory elements versus the temperature of each memory element is illustrated in FIG. 6. As indicated in FIG. 6, these three elements comprise: (1) a barriered memory element made in accordance with the present invention; (2) a non-barriered memory element "A" with welded leads; and (3) a non-barriered memory element "B" with soldered leads. Dimension "R" in FIG. 6 is representative of a range of normal memory element operating temperatures between 37° C. and 50° C. Each of the above-noted barriered and non-barriered memory elements were "cycled" as a result of undergoing a plurality of martensitic transformation cycles prior to testing.

It will be understood that the tip of each memory element of the type illustrated in FIGS. 1 and 4 will exert a force on a tip-contacting force-measuring sensor as the tip-bearing distal end of the memory element moves to assume its predetermined shape. For example, a predetermined bent shape is illustrated in U.S. Pat. No. 4,543,090 to McCoy.

A barriered memory element having a welded silver lead generates substantially greater tip force over a wide range of applied temperatures than non-barriered memory elements having either welded or soldered silver leads as indicated in FIG. 6. This data suggests that the shape-memory effect is more pronounced in barriered memory elements than in non-barriered memory elements since barriered memory elements exert significantly greater movement-inducing tip forces than non-barriered memory elements at equivalent temperatures. In other words, such element tip forces provide a reliable indication of the ability of a memory element to move to assume its predetermined shape when exposed to a predetermined transition temperature. In practice, such an ability increases in proportion to increased tip force. Accordingly, an advantageous improvement in operation of the barriered memory element over conventional non-barriered memory elements is clearly evident.

Another representative embodiment of an energy-treated uncontaminated memory element 20 is illustrated in FIG. 5. Although the orientation of partition means 126 is varied with respect to the memory element 120, the partition means 126 continues to bifurcate the memory element 120 to isolate ionic material 118 and lead-attachment portion 128, thereby preventing migration into shape-memory portion 130. It is expected that partition means could be oriented in a variety of attitudes relative to memory element 120 to provide the durability-enhancing features of the present invention.

Figure 7:
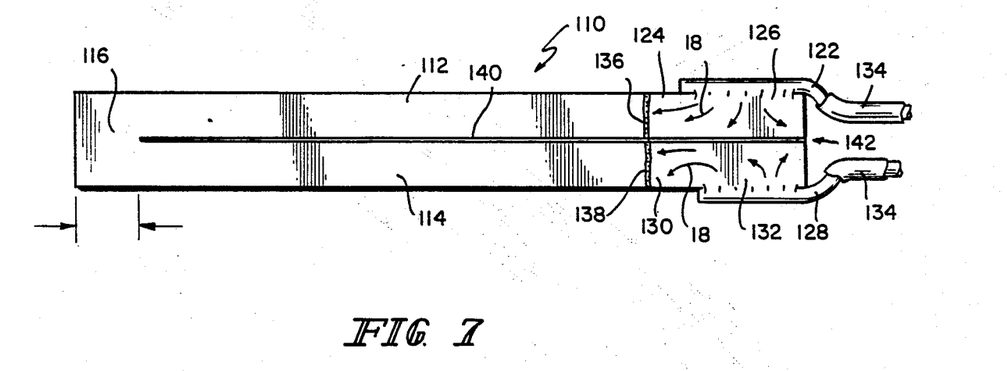
FIG. 7 is a plan view of another embodiment of the present invention showing one configuration of a split memory element.
Figure 8:
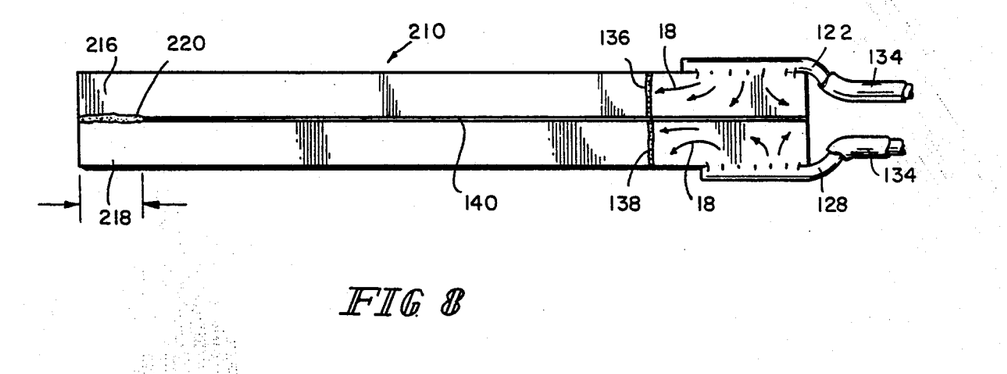
FIG. 8 is a view similar to FIG. 7 showing another configuration of a split memory element.

The embodiments of FIGS. 7 and 8 illustrate a pair of memory elements 110 and 210 which are formed to include the ion contamination barrier means disclosed in connection with the embodiments of FIGS. 1-5. Thus, each of these memory elements 110 and 210 is able to move to assume a predetermined shape repeatedly when heated to a characteristic transition temperature without experiencing significant functional degradation due to ion contamination or the like.

Further, each of the memory elements 110 and 210 is a conductor and is split in accordance with the present invention to increase its resistance in comparison to a memory element of identical mass and surface area configured as memory element 10 in FIG. 1. Essentially, such increased resistance results in decreased current flow through the memory elements 110, 210 in use, thereby permitting a significant reduction in size of the cross-sectional area of the lead wires employed to conduct electricity to the memory elements. The compactness and flexibility of a memory element assembly is advantageously maximized by reducing the cross-sectional area of the memory element lead wires.

Referring to FIG. 7, memory element 110 is made of a shape-memory alloy such as nitinol and includes a first leg or strip member 112 and a second leg or strip member 114. The memory element 110 also includes a tip member 116 integrally connected to a proximal portion 118 of first strip member 112 and also to a proximal portion 120 of second strip member 114 so that the first and second strip members 112 and 114 are aligned in spaced-apart parallel relation as shown in FIG. 7.

A first wire lead 122 is connected to a distal Portion 124 of first strip member 112 at junction 126 by conventional connection means (e.g., welding, soldering, etc.) and a second wire lead 128 is connected to a distal portion 130 of second strip member 114 at junction 132 also using conventional connection means to conduct electricity to the memory element for element-heating purposes. Typically, wire leads 122 and 128 are made of silver and are partially covered with insulation 134.

The ion contamination barrier or partition means in memory element 110 is provided by using the technique disclosed in connection with the embodiments of FIGS. 1-5 to form a first barrier means 136 in the first strip member 112 at the interface between the proximal or shape-memory portion 118 and the distal or lead-attachment portion 124 and a second barrier means 138 in the second strip member 114 at the interface between the proximal or shape-memory portion 120 and the distal or lead-attachment portion 130. In this way, the first and second barrier means 136, 138 cooperate to block transmigration of selected ions between the distal portions 124, 130 and the proximal portions 118, 120 to preserve the shape-memory effect characteristics of the basic alloy comprising the proximal portions 118, 120 and the tip member 116.

An electrical insulator 140 is disposed in the longitudinally extending space or slit 142 provided between the spaced-apart parallel first and second strip members 112, 114. Insulator 140 acts to block electrical communication between the first and second strip members 112, 114 except along a path through tip member 116. Thus, first lead wire 122 is electrically coupled to second lead wire 128 along a conductive path provided in series by first strip member 112, tip member 116, and second strip member 114. Thus, members 112, 116, and 114 cooperate to define a U-shaped shape-memory portion wherein the tip member 116 forms a bight of the U-shaped shape memory portion.

Insulator 140 is made of a material which functions to bond the first and second strip members 112, 114 together so that at least the proximal portions 118, 120 of the first and second strip members 112, 114 move in unison in the same direction to assume a predetermined shape when the memory element 110 is heated to its transition temperature. For example, urethane is a suitable insulator which is flexible and provides satisfactory bonding strength. Alternatively, epoxy, polyimids, and other bondable insulating materials could also be used to provide insulator 40.

A split memory element 110 in accordance with the present invention is illustrated in FIG. 7. One advantage of this split design over the memory element 10 of FIG. 1 is that the magnitude of the flow of electric current in memory element 110 is about one-half that of memory element 10 assuming memory elements 10, 110 have the same mass and surface area. Thus, the cross-sectional area of lead wires 122 and 128 in FIG. 7 can be significantly less than that of lead wires 12 in FIG. 1 because of the comparative reduction in the current flowing through the split memory element 110. This current reduction is brought about by the split configuration of memory element 110 since it increases the resistance of memory element by a factor of four in comparison to a memory element 10 of similar mass and surface area.

It will be appreciated by those of ordinary skill in the art that resistance of an electrical conductor is directly proportional to the length of the conductor and inversely proportional to this cross-sectional area. Consequently, a conductor of length 1, cross-sectional area A, and resistivity P has a resistance R which is given by the equation:

$$R = \rho \frac{l}{A}$$

It will be appreciated that the effective length of memory element 110 is about twice that of memory element 10 because of the split configuration of memory element 10. Further, the cross-sectional area of memory element 110 is one-half that of memory element 10. Therefore, in accordance with the foregoing equation, the resistance of memory element 110 is about four times that of memory element 10, assuming member elements 110, 10 have the same surface area and are made of the same shape-memory alloy.

Still further, assuming that the power required to raise the temperature of each of memory elements 110, 10 to the transition temperature is about the same, then it follows that the ratio of current flowing in memory element 110 to that of memory element 10 can be determined in accordance with the following equation.

$$P = i^2 R$$

wherein:
P is the power applied to the memory element;
i is the current flowing in the memory element; and
R is the resistance of the memory element.

Thus, a calculation for the current in memory element 110 as a function of the current in memory element 110 using the foregoing equation indicates that the magnitude of current in memory element 110 is one-half that of memory element 10. Advantageously, a lead wire of smaller cross-sectional area can be used to conduct electricity to memory element 10. The smaller the lead wire, the more compact and flexible the package comprising the memory element with attached lead wires will be.

Another advantage of split memory element 110 is that both lead wires 122, 128 are attached to only one end of the memory element 110. This also improves the compactness of the memory element package.

In another embodiment of the invention illustrated in FIG. 8, those elements referenced by numbers identical to those in FIGS. 1-7 perform the same or similar function. As shown in FIG. 8, split memory element 210 is made of a shape-memory alloy such as nitinol includes a fist leg 212 aligned in spaced-apart parallel relation to a separate second leg 214. Split memory element 210 is formed by welding or otherwise joining together two ends 216, 218 of legs 212, 214 using connecting means 220 as shown in FIG. 8 to form the bight of the generally V-shaped memory element. Split memory element 210 functions in the same manner as split memory element 110 because of the provision of insulator 140 and first and second barrier means 136, 138.

Although the invention has been described in detail with reference to preferred embodiments and specific examples, variations and modifications exist within the scope and spirit of the invention as described and as defined in the following claims.

What is claimed is:

1. A memory element comprising
a tip member, and
first and second strip members aligned in side-by-side relation, each of the tip member, first strip member, and second strip member being made of a shape-memory alloy and having a characteristic internal structure, each strip member including a proximal portion coupled to the tip member, a distal portion, and partition means for interconnecting the proximal and distal portions, each partition means having an internal structure which is dissimilar to the characteristic internal structure of the tip member and the first and second strip members.

2. The memory element of claim 1, wherein the dissimilar internal structure in each strip member is configured to block transmigration of selected ions between its proximal and distal portions.

3. The memory element of claim 1, further comprising an electrically conductive lead connected to each of the distal portions, the dissimilar internal structures of the partition means cooperating to provide means for blocking transmigration between the distal portions and the first strip, second strip, and tip members of selected ions indigenous to the electrically conductive leads to control the concentration of said selected ions in the first strip, second strip, and tip members.

4. The memory element of claim 1, wherein the distal portions cooperate to define a lead-attachment part, the tip member and the proximal portions cooperate to define a shape-memory part, at least the shape-memory part moves to assume a predetermined shape when heated to a predetermined temperature, and the partition means includes means for communicating energy from the lead-attachment part to heat the shape-memory part to its predetermined temperature so that at least the shape-memory part assumes its predetermined shape.

5. The memory element of claim 1, wherein the first and second strip members are aligned relative to one another to define a space therebetween extending between the tip member and the terminal ends of both distal portions.

6. The memory element of claim 1, further comprising insulator means disposed between the first and second strip members for blocking conduction of electrical current between the first and second strip members along a path bypassing the tip member.

7. The memory element of claim 6, wherein the first and second strip members cooperate to define a space therebetween extending between the tip member and the terminal ends of both distal portions and the insulator means is situated in the space.

8. The memory element of claim 7, wherein the insulator means is arranged substantially to fill said space.

9. The memory element of claim 6, wherein the insulator means includes means for bonding the first and second strip members together so that at least the proximal portions of the first and second strip members move in unison to assume a predetermined shape when heated to a predetermined temperature.

10. The memory element of claim 9, further comprising first and second electrically conductive leads, first connection means for coupling the first electrically conductive lead to the distal portion of the first strip member to permit introduction of an electrical current into the first strip member, and second connection means for coupling the second electrically conductive lead to the distal portion of the second strip member to ground the second strip member, the dissimilar internal structure of the partition means in the first strip member being configured to provide means for communicating electrical current introduced into the distal portion of the first strip member to the proximal portion of the first strip member, and the dissimilar internal structure of the partition means in the second strip member being configured to provide means for communicating electrical current conducted into the proximal portion of the second strip member via the proximal portion of the first strip member and the tip member to the grounded distal portion of the second strip member so that at least the tip member and the proximal portions of the first and second strip members move to assume the predetermined shape when heated to the predetermined temperature by electrical current being conducted therethrough.

11. The memory element of claim 1, further comprising first and second electrically conductive leads, first connection means for coupling the first electrically conductive lead to the distal portion of the first strip member to permit introduction of an electrical current into the first strip member, and second connection means for coupling the second electrically conductive lead to the distal portion of the second strip member to ground the second strip member, the dissimilar internal structure of the partition means in the first strip member being configured to provide means for communicating electrical current introduced into the distal portion of the first strip member to the proximal portion of the first strip member, and the dissimilar internal structure of the partition means in the second strip member being configured to provide means for communicating electrical current conducted into the proximal portion of the second strip member via the proximal portion of the first strip member and the tip member to the grounded distal portion of the second strip member so that at least the tip member and the proximal portions of the first and second strip members move to assume the predetermined shape when heated to the predetermined temperature by the electrical current being conducted therethrough.

12. A memory element comprising
first and second lead-attachment portions,
a U-shaped shape-memory portion including first and second leg members, each leg member including a proximal end and a distal end, and a bight member interconnecting the proximal ends of the first and second leg members,
first barrier means interconnecting the first lead-attachment portion and the distal end of the first leg member for blocking transmigration of selected ions from the first lead-attachment portion to the shape-memory portion to control the concentration of said selected ions in the shape-memory portion, and
second barrier means interconnecting the second lead attachment portion and the distal end of the second leg member for blocking transmigration of the selected ions from the second lead-attachment portion to the shape-memory portion to control the concentration of said selected ions in the shape-memory portion, the lead-attachment portions, the shape-memory portion, and the first and second barrier means being made of a shape-memory alloy.

13. The memory element of claim 12, wherein each of the shape-memory and lead-attachment portions has a characteristic internal structure and the first and second barrier means have a dissimilar internal structure.

14. The memory element of claim 12, further comprising insulator means disposed between the first and second strip members for blocking conduction of electrical current between a first element section including the first leg member and the first lead-attachment portion and a second element section including the second leg member and the second lead-attachment portion along a path bypassing the bight member.

15. The memory element of claim 12, further comprising insulator means for bonding the first leg member to the second leg member without establishing an electrically conductive path between the first and second leg members which bypasses the bight member.

16. The memory element of claim 12, further comprising insulator means for bonding the first lead-attachment portion to the second lead-attachment portion without establishing an electrically conductive path between the first and second lead-attachment portion which bypasses the bight member.

17. The memory element of claim 12, further comprising first and second electrically conductive leads, first connection means for coupling the first electrically conductive lead to the first lead-attachment portion to apply an electrical current to the memory element, and second connection means for coupling the second electrically conductive lead to the second lead-attachment portion to ground the memory element.

18. The memory element of claim 17, wherein the first barrier means is configured to provide means for communicating electrical current introduced into the first lead-attachment portion to the first leg member and the second barrier means is configure to provide means for communicating electrical current, conducted into the second leg member to the grounded second lead-attachment portion so that at least the shape-memory portion moves to assume a predetermined shape when heated to a predetermined temperature by electrical current being conducted therethrough.

19. A memory element comprising
a first strip member made of a shape-memory alloy and including a first lead-attachment portion, a first shape-memory portion, and first partition means for interconnecting the first lead-attachment and shape-memory portions,
a second strip member made of the shape-memory alloy and including a second lead-attachment portion, a second shape-memory portion, and second partition means for interconnecting the second lead-attachment and shape-memory portions, and
means interconnecting the first and second shape-memory portions for conducting electrical current in the first shape-memory portion to the second shape-memory portion.

20. The memory element of claim 19, wherein the shape-memory alloy has a first internal structure, each lead-attachment portion and each shape-memory portion have said first internal structure, each partition means has a dissimilar second internal structure, the first partition means is formed by exposing a selected portion of the first internal structure between the first lead-attachment and shape-memory portions to an energy source and the second partition means is formed by exposing a selected portion of the first internal structure between the second lead-attachment and shape-memory portions to an energy source.

21. The memory element of claim 20, wherein each energy source is a laser.

22. The memory element of claim 19, wherein the conducting means and the first and second strip members are unitarily formed of a single member made of shape-memory alloy.

23. The memory element of claim 22, wherein the single member is U-shaped, the first and second strip members cooperate to define legs of the U-shaped member, and the conducting means is configured to define a bight interconnecting the legs of the U-shaped member.

24. The memory element of claim 23, wherein the first and second strip members are disposed in spaced-apart parallel relation, and further comprising insulator means for preventing establishment of an electrical connection of the lead-attachment and shape-memory portions of the first strip member with the lead-attachment and shape-memory portions of the second strip member apart from an electrical connection provided by the conducting means, the insulator means being disposed in a space defined between the spaced-apart first and second strip members.

25. The memory element of claim 24, wherein the insulator means includes means for bonding at least the first and second shape-memory portions together so that at least the conducting means and the first and second shape-memory portions move in unison to assume a predetermined shape when heated to a predetermined temperature.

26. The memory element of claim 19, wherein the conducting means is formed by welding a distal end of the first shape-memory portion to a distal end of the second shape-memory portion while the first and second shape-memory portions are aligned in side-by-side, spaced-apart relation.

27. The memory element of claim 26, wherein the conducting means and the first and second strip members cooperate to define a substantially U-shaped member having a longitudinally extending apace, provided between the first and second strip members.

28. The memory element of claim 27, further comprising insulator means disposed in the longitudinally extending space for blocking electrical communication between adjacent lead-attachment portions and between adjacent shape-memory portions along any path bypassing the conducting means.

29. The memory element of claim 28, wherein the insulator means includes means for bonding at least the first and second shape-memory portions together so that at least the conducting means and the first and second shape-memory portions move in unison to assume a predetermined shape when heated to a predetermined temperature.

30. A method of making a temperature-activated memory element, the method comprising the steps of
providing an elongated U-shaped mechanism made of a shape-memory alloy having a crystalline structure and a slit extending along the longitudinal axis of the mechanism from one of the ends of the mechanism to a point in close proximity to the other of the ends of the mechanism to define a pair of longitudinally extending legs and a bight interconnecting the pair of legs,
exposing a first selected portion of the first leg of the mechanism to an energy source to divide the first leg into a proximal first shape-memory portion coupled to the bight and a distal first lead-attachment portion,
exposing a second selected portion of the second leg of the mechanism to the energy source to divide the second leg into a proximal second shape-memory portion coupled to the bight and a distal second lead-attachment portion, and
continuing the exposing steps for at least a predetermined period of time sufficient to disrupt the crystalline structure of the first and second selected portions to alter the crystalline structure to provide a dissimilar structure configured to block transmigration of selected ions between each lead-attachment portion and its companion shape-memory portion.

31. The method of claim 30, further comprising the step of inserting an insulator into the slit to block electrical communication between the pair of legs along a path extending across the slit.

32. The method of claim 30, wherein the providing step includes the steps of furnishing a unitary sample of a shape-memory alloy and cutting the unitary sample along its longitudinal axis to define the slit so that the pair of longitudinally extending legs and the bight are formed.

33. The method of claim 30, wherein the providing step includes the steps of furnishing a pair of elongated strips made of the shape-memory alloy, aligning the strips in side-by-side relation so that a distal end of the first shape-memory portion is adjacent to a distal end of the second shape-memory portion, and welding the distal ends of the first and second shape-memory portions together to define the bight.

34. The method of claim 30, further comprising the steps of connecting one electrically conductive lead to the first lead-attachment portion and connecting another electrically conductive lead to the second lead-attachment portion, the connecting steps occurring after the exposing and continuing steps to provide means for applying an electric current to the mechanism, each of the first and second selected portions providing a partition intermediate its companion lead-attachment and shape-memory portions to isolate in the lead-attachment portion selected ions communicated from the electrically conductive lead to the lead-attachment portion.

* * * * *

UNITED STATES PATENT AND TRADEMARK OFFICE
CERTIFICATE OF CORRECTION

PATENT NO. : 4,918,919

DATED : April 24, 1990

INVENTOR(S) : McCoy et al.

It is certified that error appears in the above-identified patent and that said Letters Patent is hereby corrected as shown below:

In column 2, line 45, replace "Provide" with --provide--.

In column 10, line 36, replace "$R = P\frac{1}{A}$" with --$R = P^{\frac{1}{A}}$--.

In column 13, line 59, replace "configure" with --configured--.

Signed and Sealed this

Nineteenth Day of November, 1991

Attest:

HARRY F. MANBECK, JR.

Attesting Officer

Commissioner of Patents and Trademarks